United States Patent [19]

Hamaguchi

[11] Patent Number: 5,337,247
[45] Date of Patent: Aug. 9, 1994

[54] EXPOSURE DATA FORMING METHOD, PATTERN FORMING METHOD, PATTERN EXPOSURE METHOD AND PATTERN EXPOSURE APPARATUS

[75] Inventor: Shinichi Hamaguchi, Kawasaki, Japan

[73] Assignee: Fujitsu Limited, Kawasaki, Japan

[21] Appl. No.: 708,990

[22] Filed: May 31, 1991

[30] Foreign Application Priority Data

Jun. 1, 1990 [JP] Japan .................................. 2-145064

[51] Int. Cl.$^5$ ................................................ G06F 15/60
[52] U.S. Cl. ................................. 364/468; 364/490; 364/491; 250/491.1; 250/492.2
[58] Field of Search ............... 250/491.1, 492.3, 492.2, 250/491.22; 364/468, 488, 489, 490, 491; 378/34

[56] References Cited

U.S. PATENT DOCUMENTS

| | | | |
|---|---|---|---|
| 4,151,421 | 4/1979 | Sumi | 378/34 X |
| 4,259,724 | 3/1981 | Sugiyama | 364/491 |
| 4,531,191 | 7/1985 | Koyama | 364/491 |
| 4,586,141 | 4/1986 | Yasuda et al. | 250/492.22 X |
| 4,849,901 | 7/1989 | Shimizu | 364/490 X |
| 4,853,870 | 8/1989 | Yasutake et al. | 250/492.22 X |
| 4,878,177 | 10/1989 | Ikenaga et al. | 250/492.22 X |
| 4,950,910 | 8/1990 | Yasuda et al. | 250/492.2 X |
| 5,008,830 | 4/1991 | Mortizumi et al. | 364/490 |
| 5,046,012 | 9/1991 | Morishita | 364/491 X |
| 5,253,182 | 10/1993 | Suzuki | 364/489 |

FOREIGN PATENT DOCUMENTS 0055479 7/1982 European Pat. Off. .
1-82530 3/1989 Japan .

OTHER PUBLICATIONS

Patent Abstracts of Japan, vol. 11, No. 271 (E-536), Sep. 3, 1987 & JP-A-62 072 124 (Toshiba Corp.), Apr. 2, 1987.

Primary Examiner—Jerry Smith
Assistant Examiner—Brian C. Oakes
Attorney, Agent, or Firm—Staas & Halsey

[57] ABSTRACT

An exposure data organizing method, and an exposure apparatus operable in accordance with the method, organizes exposure data defining a composite pattern to be exposed. The composite pattern comprises at least one compressed, repeating exposure pattern and a non-compressed, non-repeating exposure pattern each comprising plural predefined unit deflection region to which respectively corresponding portions of the exposure data relate. The exposure patterns are relatively arranged in accordance with the composite pattern and respective, individual identifying members are assigned thereto. Exposure order numbers then are assigned to the unit deflection regions, as identified by the respective individual identifying members and so as to define a sequential order of the exposure of the unit deflection regions, determined in accordance with minimizing the length of a path through which the exposure beam is deflected when proceeding from the exposure of one to the exposure of a next successive one of the unit deflection regions, for all of the unit deflection regions. The portions of the exposure data corresponding to the unit deflection regions are processed in the sequence defined by the exposure order numbers for controlling the exposure of each unit deflection region on the object and further the exposing beam is deflected in accordance with the zigzag path to the successive unit deflection regions.

15 Claims, 14 Drawing Sheets

FIG. IA PRIOR ART
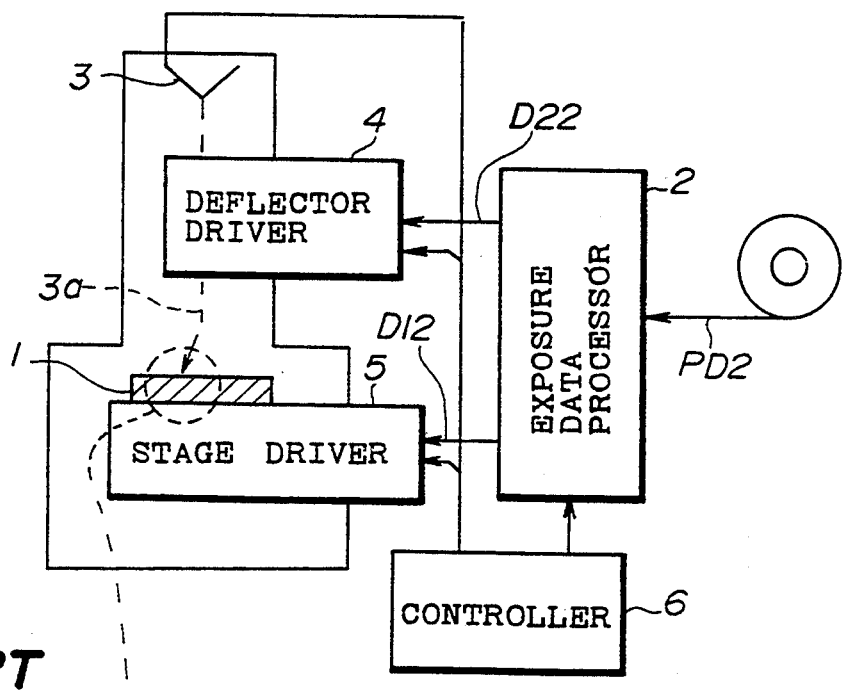
FIG. IB PRIOR ART
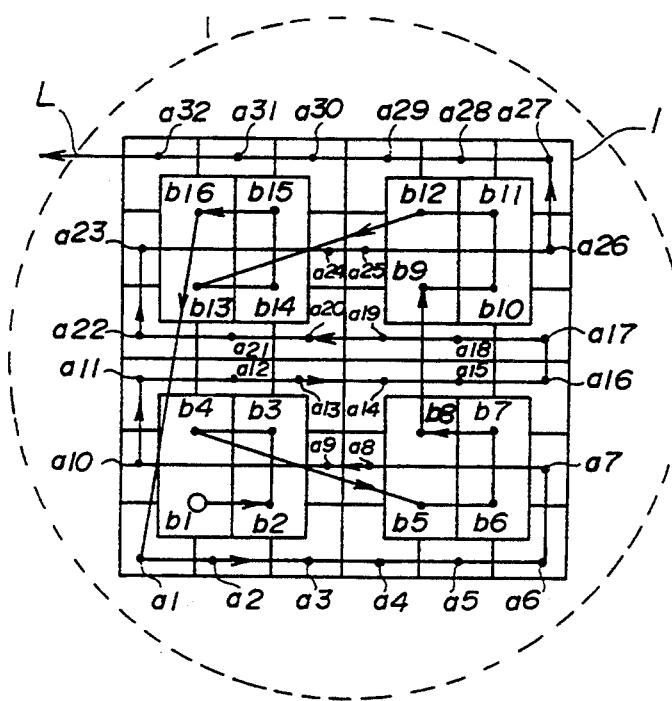

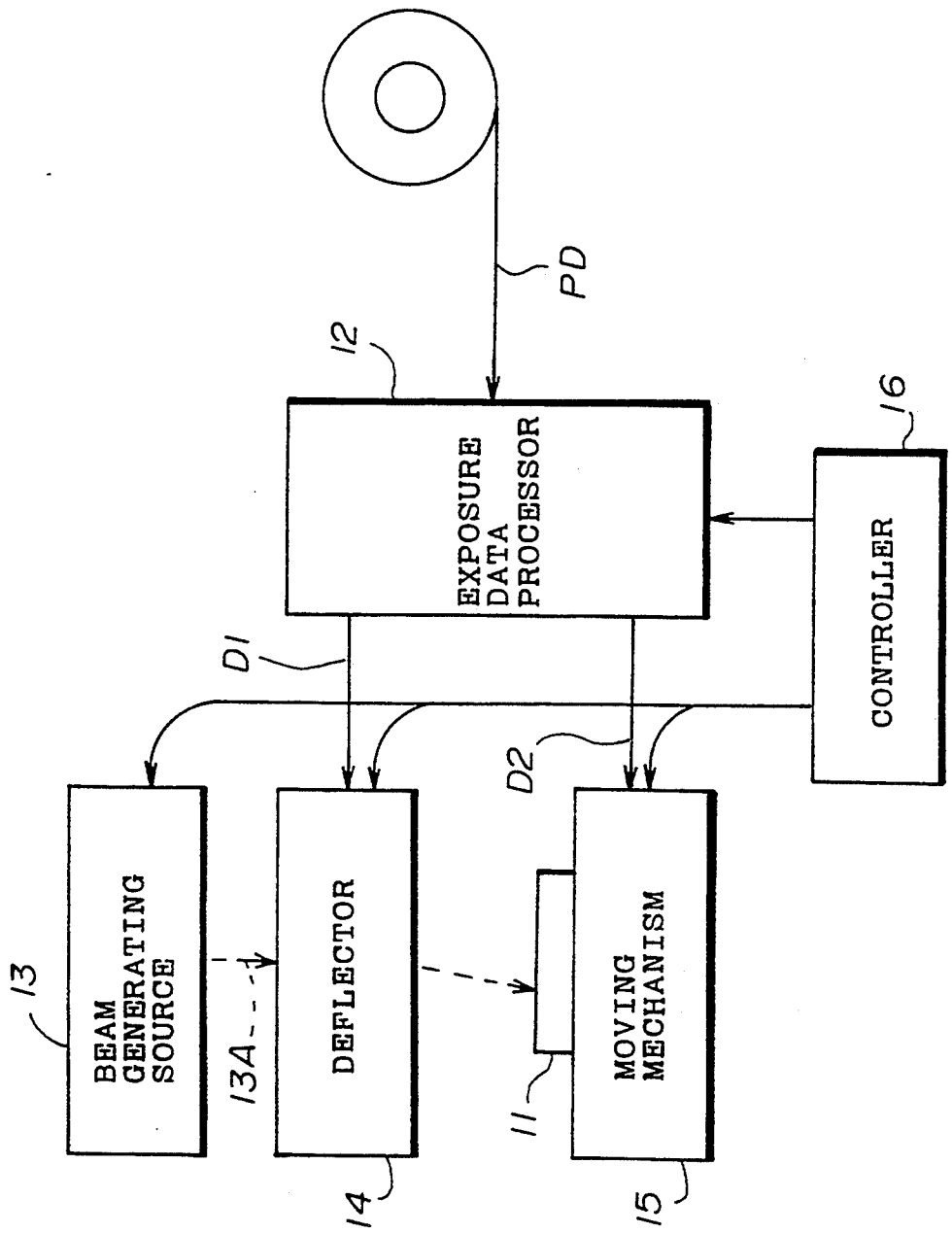

EXPOSURE DATA FORMING METHOD, PATTERN FORMING METHOD, PATTERN EXPOSURE METHOD AND PATTERN EXPOSURE APPARATUS

BACKGROUND OF THE INVENTION

The present invention generally relates to exposure data forming (i.e., organizing) methods, pattern forming methods, pattern exposure methods and pattern exposure apparatuses. More particularly, the present invention relates to an exposure data forming method for forming exposure data in which non-compressed and compressed exposure patterns coexist, a pattern forming method for forming a pattern using such an exposure data, and pattern exposure method and apparatus for exposing a pattern using such an exposure data.

Recently, there are demands to further improve the integration density and operation speed of large scale integrated circuit (LSI) devices. In order to meet such demands, a reticle or the like is used to form a pattern in a charged particle beam exposure apparatus. In the reticle, the original pattern or mask is enlarged with a predetermined magnification.

The original pattern of the semiconductor device is divided into basic unit patterns such as rectangular and trapezoidal patterns, and the exposure process is carried out using exposure data related to such basic unit patterns. For example, when producing a memory device having a memory capacity of several Mbits, a compressed exposure pattern having a hierarchical data structure is used for a memory cell because the memory cell is made up of a repetition of basic patterns. On the other hand, a peripheral circuit of the memory device is made up of non-repeating patterns, and non-compressed exposure patterns are used for the peripheral circuit. Accordingly, exposure data, of an extremely large quantity due to the large integration density, are effectively compressed and simplified.

However, when carrying out the exposure process on the exposure data in which the non-compressed and compressed exposure patterns coexist, a stage which carries an object which is to be subjected to the exposure must make unnecessary moves. As a result, there are problems in that it takes a long time to carry out the exposure process and the throughput of the exposure apparatus becomes poor.

Therefore, there are demands for an exposure data forming method which forms exposure data which enable efficient exposure, and to afford a pattern exposure method and a related apparatus which carry out such an efficient exposure. There are also demands to realize a pattern forming method which forms a pattern of a mask, reticle or a semiconductor device using such an efficient exposure.

FIG. 1A generally shows an example of a conventional electron beam exposure apparatus, and FIG. 1B shows a scanning locus of an electron beam. FIG. 2 generally shows an exposure process of the conventional electron beam exposure apparatus.

The electron beam exposure apparatus shown in FIG. 1A includes an electron gun 3 for emitting an electron beam 3a, an exposure data processor 2 for outputting deflection data D22 and moving (i.e., movement) data D12 in response to exposure data PD2, a deflector driver 4 for deflecting the electron beam 3a based on the deflection data D22, a stage driver 5 for moving a stage which carries an object 1 which is to be exposed based on the moving (i.e., movement) data D12, and a controller 6. The controller 6 controls input and output of the electron gun 3, the exposure data processor 2, the deflector driver 4 and the stage driver 5.

The electron beam 3a emitted from the electron gun 3 is deflected responsive to the deflection data D22 which is subjected to data processing based on the exposure data PD2. As a result, an LSI pattern, for example, is exposed on the object 1 which is moved by the stage based on the moving (i.e., movement) data D12.

When producing a memory device having a memory capacity on the order of several Mbits, for example, compressed exposure patterns are used for the memory cell which is made up of a repetition of basic patterns, while non-compressed exposure patterns are used for the peripheral circuit which is made up of non-repeating patterns. Hence, the exposure data PD2 is compressed and simplified.

However, because the non-compressed and compressed exposure patterns coexist, the stage and thus the object 1 must make unnecessary moves as will be described in conjunction with FIGS. 1B and 2.

FIG. 1B shows a scanning locus L of the electron beam 3a on the object 1 which carried on the stage. This scanning locus L is generated when each region of the object 1 to be exposed is moved, that is, when the stage which carries the object 1 moves. In FIG. 1B, regions a1 through a32 indicate regions in which the non-compressed exposure patterns are exposed, and regions b1 through b16 indicate regions in which the compressed exposure patterns are exposed. As shown, the scanning locus L of the electron beam 3a is complex.

The scanning locus L of the electron beam 3a becomes complex due to the exposure process shown in FIG. 2. For example, based on the exposure data PD2 in which the non-compressed and compressed exposure patterns coexist, a step P1 shown in FIG. 2 aligns the electron beam 3a relative to the region b1 in which the compressed exposure pattern is exposed. A step P2 carries out the exposure process for the regions b1 through b4. Next, a step P3 moves the electron beam 3a from the region b4 to the region b5. Thereafter, a step P4 carries out the exposure process for the regions b5 through b8.

Next, steps P5 through P8 are carried out. As a result, the region in which the compressed exposure pattern is exposed is successively changed from the region b8 and the exposure process is carried out for the regions b9 through b16. Then, a step P9 moves the electron beam 3a from the region b16 to the region a1 in which the non-compressed exposure pattern is exposed, and a step P10 carries out the exposure process for the regions a1 through a6. Steps P11 through P21 are carried out similarly, so that the region in which the non-compressed exposure pattern is exposed is successively changed from the region a6 and the exposure process is carried out for the regions a7 through a32.

The LSI pattern in which the non-compressed and compressed exposure patterns coexist is exposed through the above complex moves of the stages. For this reason, there is a problem in that the time it takes for the exposure process as a whole is considerably long due to the time required to move the stage so that the electron beam moves from one region to another adjacent region. Furthermore, there is a problem in that the throughput of the exposure apparatus becomes poor due to the long exposure time.

SUMMARY OF THE INVENTION

Accordingly, it is a general object of the present invention to provide novel and useful exposure data forming method, pattern forming method, pattern exposure method and pattern exposure apparatus, in which the above described problems are eliminated.

Another and more specific object of the present invention is to provide an exposure data forming method which forms exposure data for an object which is to be exposed by an exposure beam in an exposure apparatus, comprising the steps of (a) arranging a non-compressed exposure pattern and a compressed exposure pattern for which unit deflection regions on the object are respectively predefined, where each unit deflection region is a region in which the exposure beam can be deflected by a maximum deflection quantity, (b) assigning individual numbers to each unit deflection region of the non-compressed and compressed exposure patterns, (c) assigning exposing order numbers to each unit deflection region, and (d) processing exposure data related to each of the unit deflection regions by correlating the exposure data with corresponding individual number and exposure order number. According to the exposure data forming method of the present invention, it is possible to rearrange the data with ease even when the compressed exposure pattern is synthesized within the non-compressed exposure pattern.

Still another object of the present invention is to provide a pattern exposure method for exposing a pattern on an object by an exposure beam in an exposure apparatus, comprising the steps of (a) forming exposure pattern data in which data related to at least a non-compressed exposure pattern and a compressed exposure pattern coexist, where a unit deflection region is predefined for each exposure pattern and each unit deflection region is a region in which the exposure beam can be deflected by a maximum deflection quantity, and (b) successively exposing the exposure patterns on the object along a scanning locus using the exposure beam based on the exposure pattern data by moving the object, where the scanning locus is a zigzag locus which connects the unit deflection regions through shortest paths. According to the pattern exposure method of the present invention, it is possible to minimize the movement of the object to be exposed, thereby reducing the exposure time as a whole.

A further object of the present invention is to provide a pattern exposure apparatus comprising exposure data processing means for producing deflection data and scan data in response to exposure data related to patterns which are to be exposed on an object, generating means for generating a charged particle beam which irradiates the object, deflector means, coupled to the exposure data processing means, for deflecting the charged particle beam based on the deflection data, moving means, coupled to the exposure data processing means, for carrying and moving the object based on the scan data, and control means coupled to and controlling the input and the output of the exposure data processing means, the generating means, the deflector means and the moving means, where the exposure data include data related to at least a non-compressed exposure pattern and a compressed exposure pattern, a unit deflection region is predefined for each exposure pattern, each unit deflection region is a region in which the charged particle beam can be deflected by a maximum deflection quantity by the deflector means, and the scan data drive the moving means so that the exposure patterns are exposed on the object along a zigzag scanning locus which connects the unit deflection regions through shortest paths based on the exposure pattern data. According to the pattern exposure apparatus of the present invention, the exposure of the patterns progresses along the zigzag scanning locus regardless of the arrangement of the non-compressed and compressed exposure patterns, and the exposure time as a whole is effectively reduced.

Another object of the present invention is to provide a pattern forming method for forming patterns on a substrate structure which is exposed by an exposure beam in an exposure apparatus, where the substrate structure includes a substrate, a pattern layer formed on the substrate and a resist layer formed on the pattern layer. The pattern forming method comprises the steps of (a) forming exposure pattern data in which data related to at least a non-compressed exposure pattern and a compressed exposure pattern coexist, where a unit deflection region is predefined for each exposure pattern and each unit deflection region is a region in which the exposure beam can be deflected by a maximum deflection quantity, (b) successively exposing the exposure patterns on the resist layer of the substrate structure along a scanning locus using the exposure beam based on the exposure pattern data by moving the substrate structure, where the scanning locus is a zigzag locus which connects the unit deflection regions through shortest paths, (c) developing the exposed resist layer so that a resist mask remains, (d) etching the pattern layer using the resist mask so that the exposure patterns are formed by the remaining pattern layer, and (e) removing the resist mask. According to the pattern forming method of the present invention, it is possible to form the patterns of a mask, a reticle or a semiconductor device in a reduced exposure time.

Other objects and further features of the present invention will be apparent from the following detailed description when read in conjunction with the accompanying drawings.

BRIEF DESCRIPTION OF THE DRAWINGS

FIG. 1A is a system block diagram generally showing an example of a conventional electron beam exposure apparatus;

FIG. 1B is a plan view showing a scanning locus of an electron beam used in the conventional electron beam exposure apparatus;

FIG. 4 is a system block diagram for explaining an operating principle of a pattern exposure apparatus according to the present invention;

DESCRIPTION OF THE PREFERRED EMBODIMENTS

First, a description will be given of an operating principle of an exposure data forming method according to the present invention, by referring to FIGS. 3A and 3B.

Figure 2:
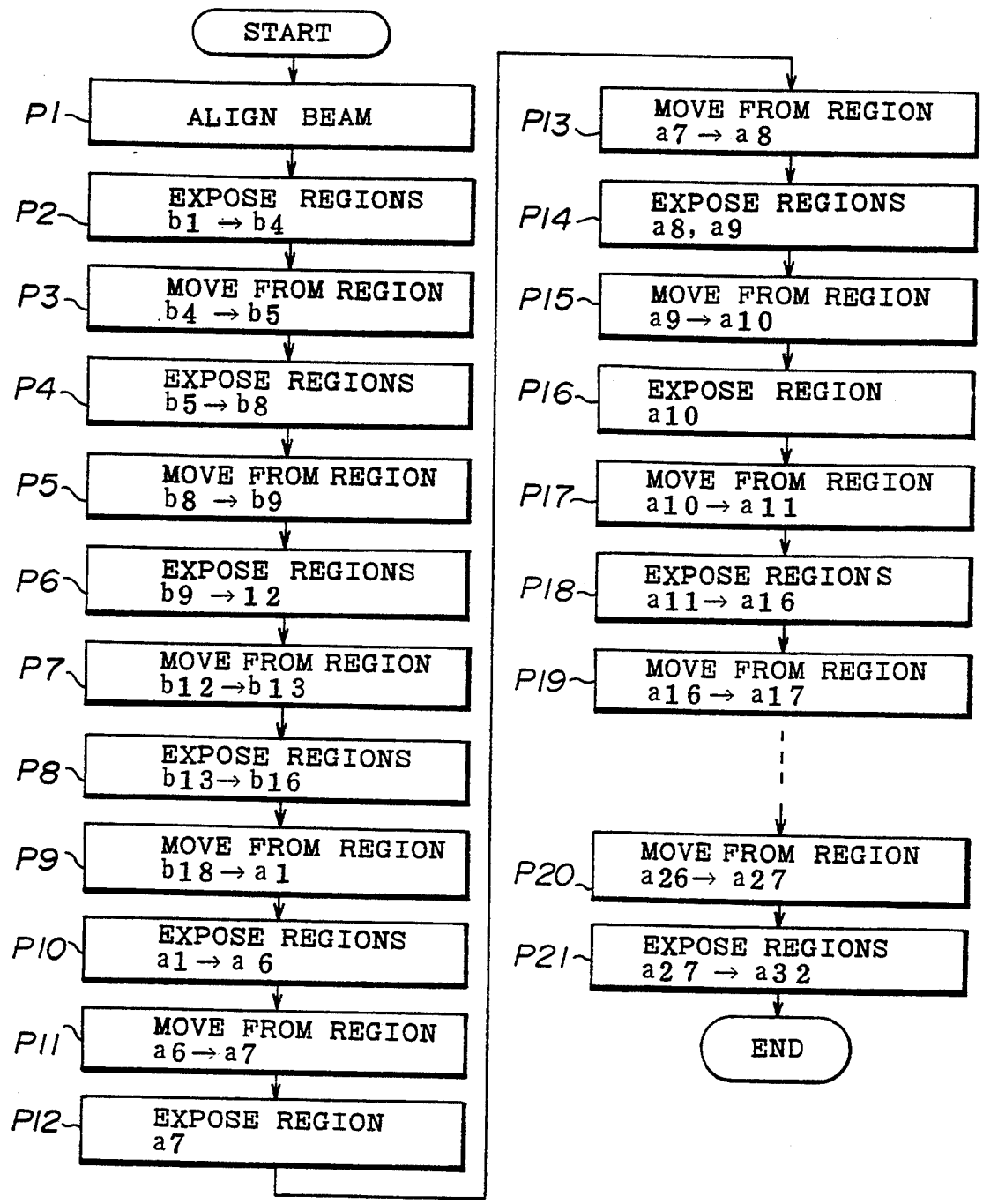
FIG. 2 is a flow chart for explaining an exposure process of the conventional electron beam exposure apparatus.
Figure 3A:
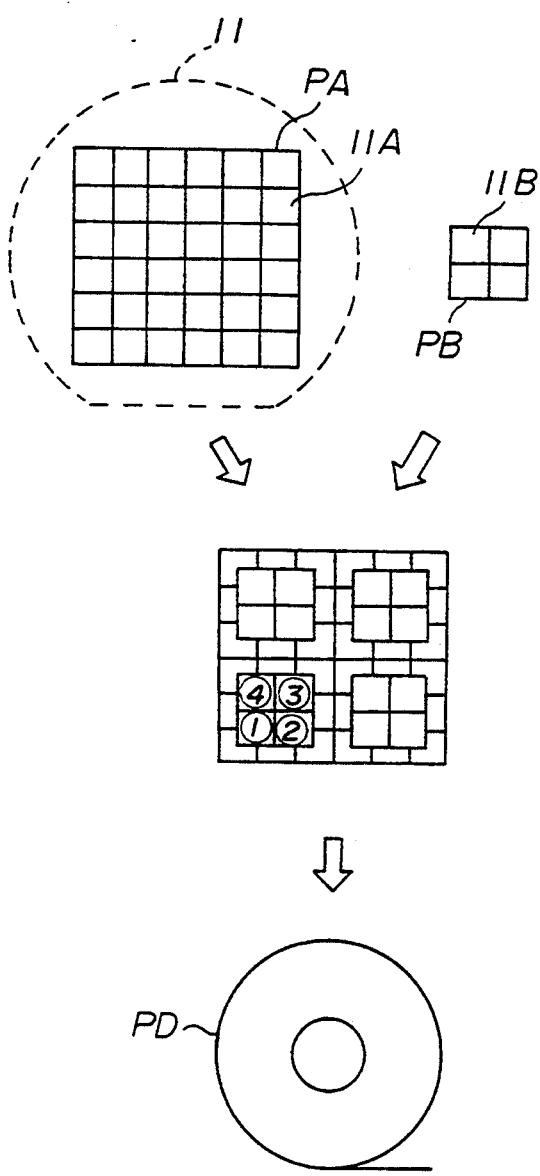
FIG. 3A is a diagram for explaining an operating principle of an exposure data forming method according to the present invention.
Figure 3B:
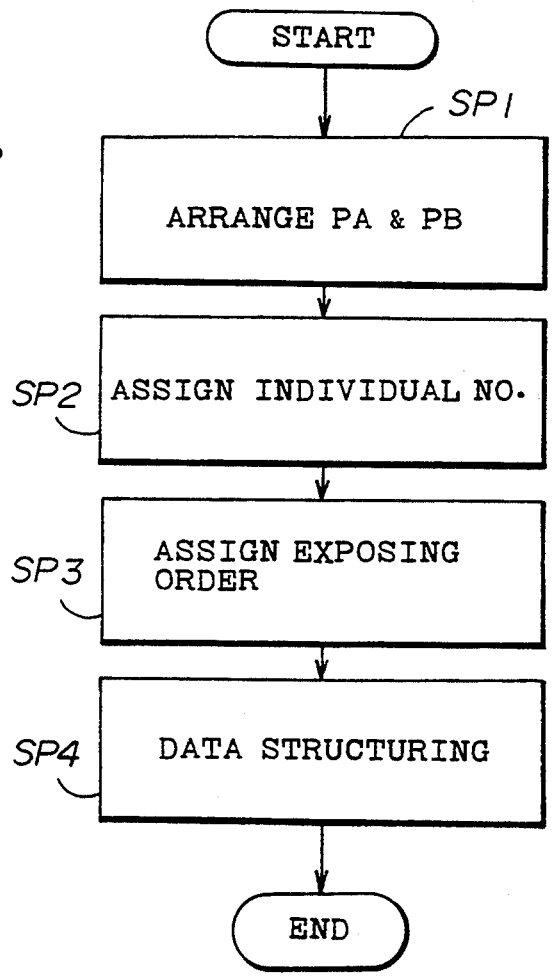
FIG. 3B is a flow chart for explaining the operating principle of an exposure data forming method according to the present invention.

The exposure data forming method forms exposure data PD for an object 11 which is shown in FIG. 3A and is to be exposed using an automatic design processing system. In FIG. 3B, a step SP1 carries out a process of arranging a non-compressed exposure pattern PA and a compressed exposure pattern PB which are respectively defined for unit deflection regions 11A and 11B. A step SP2 carries out a process of assigning independent numbers to the unit deflection regions 11A and 11B, and a step SP3 carries out a process of assigning an exposing order to the unit deflection regions 11A and 11B. Thereafter, a step SP4 carries out a process of forming (i.e., organizing) the data of the unit deflection regions 11A and 11B. The step SP3 assigns the exposing order so as to connect the unit deflection regions 11A and 11B through a shortest path.

According to the exposure data forming method of the present invention, the exposing order of the unit deflection regions 11A and 11B of the respective non-compressed and compressed exposure patterns PA and PB is determined based on the individual numbers assigned to the unit deflection regions 11A and 11B. The individual numbers assigned to the unit deflection regions 11A and 11B of the respective non-compressed and compressed exposure patterns PA and PB are extracted based on the order of exposure which connects the unit deflection regions 11A and 11B through the shortest path. For this reason, it is easy to rearrange the exposure data in which the compressed exposure pattern PB is synthesized within the non-compressed exposure pattern PA.

Therefore, it is possible to form the exposure data for carrying out a zigzag exposure with respect to the entire region, starting from one arbitrary unit deflection region 11A of the non-compressed exposure pattern PA and extending to another arbitrary unit deflection region 11A of the non-compressed exposure pattern PA while including therewithin the unit deflection region 11B of the compressed exposure pattern PB.

Next, a description will be given of an operating principle of a pattern exposure apparatus according to the present invention, by referring to FIG. 4. The pattern exposure apparatus includes an exposure data processor 12, a charged particle beam generating source 13, a deflector 14, a moving mechanism 15 and a controller 16.

The exposure data PD for the object 11 which is to be exposed is input to the exposure data processor 12 which outputs deflection data D1 and scan data D2. The charged particle beam generating source 13 generates a charged particle beam 13A for exposing the object 11. The deflector 14 deflects the charged particle beam 13A based on the deflection data D1. The moving mechanism 15 carries the object 11 and moves the object 11 based on the scan data D2 so that the object 11 is scanned by the charged particle beam 13A. The controller 16 controls the input and output of the exposure data processor 12, the charged particle beam generating source 13, the deflector 14 and the moving mechanism 15. The exposure data PD which is used is formed by the exposure data forming method described above.

The exposure data processor 12 which receives the exposure data PD for the object 11 supplies the deflection data D1 to the deflector 14 and the scan data D2 to the moving mechanism 15. In addition, the charged particle beam 13A generated from the charged particle beam generating source 13 is irradiated on the object 11. The charged particle beam 13A is deflected based on the deflection data D1, and the object 11 is moved based on the scan data D2. A zigzag exposure is carried out with respect to the entire region starting from one arbitrary unit deflection region 11A of the non-compressed exposure pattern PA to another arbitrary unit deflection region 11A of the non-compressed exposure pattern PA including the unit deflection region 11B of the compressed exposure pattern PB.

Therefore, it is possible to carry out the zigzag exposure of the non-compressed exposure patterns in which the compressed exposure patterns are synthesized.

Figure 5:
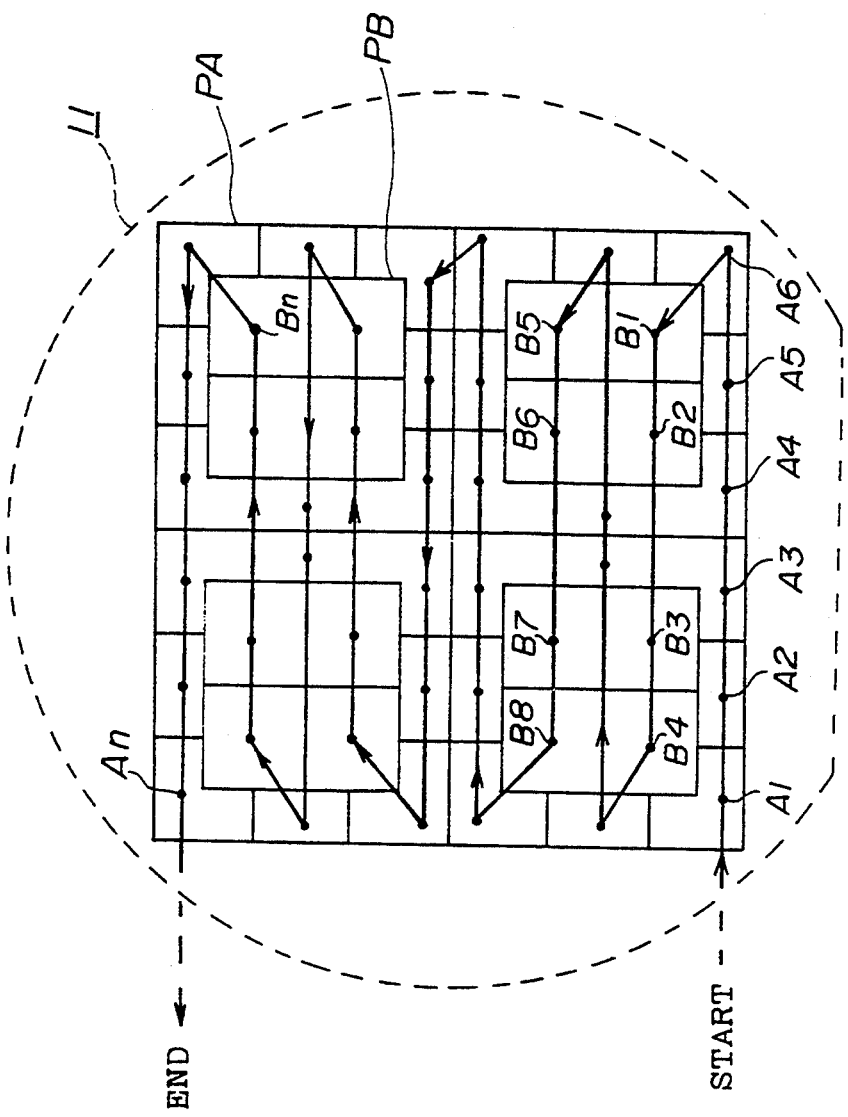
FIG. 5 is a diagram for explaining an operating principle of a pattern exposure method according to the present invention;.

Next, a description will be given of an operating principle of a pattern exposure method according to the present invention, by referring to FIG. 5. According to the pattern exposure method, the pattern exposure process is carried out on the object 11 based on the exposure data PD in which the compressed exposure pattern PB is synthesized within the non-compressed exposure pattern PA. A first exposure process, in which the non-compressed exposure pattern PA is exposed in first unit exposure regions A1 through An of the object 11, and a second exposure process in which the compressed exposure pattern PB is exposed in second unit exposure regions B1 through Bn of the object 11 are mixed. This mixed process is carried out by a zigzag scan of the object 11 including the first unit exposure regions A1 through An and the second unit exposure regions B1 through Bn with reference to an arbitrary unit exposure region Ai in which the non-compressed exposure pattern PA is exposed.

Hence, it is possible to eliminate the conventional unnecessary moves of the stage, and the exposure time as a whole can be minimized by the zigzag scan. Consequently, the efficiency of the exposure process is improved, thereby improving the throughput of the pattern exposure apparatus.

A pattern forming method according to the present invention uses the exposure data formed by the exposure data forming method described above, and forms a mask, a reticle or a semiconductor device using the pattern exposure method described above.

Next, a description will be given of an embodiment of the exposure data forming method, an embodiment of the pattern exposure method and an embodiment of the pattern exposure apparatus, by referring to FIGS. 6 through 10.

Figure 6:
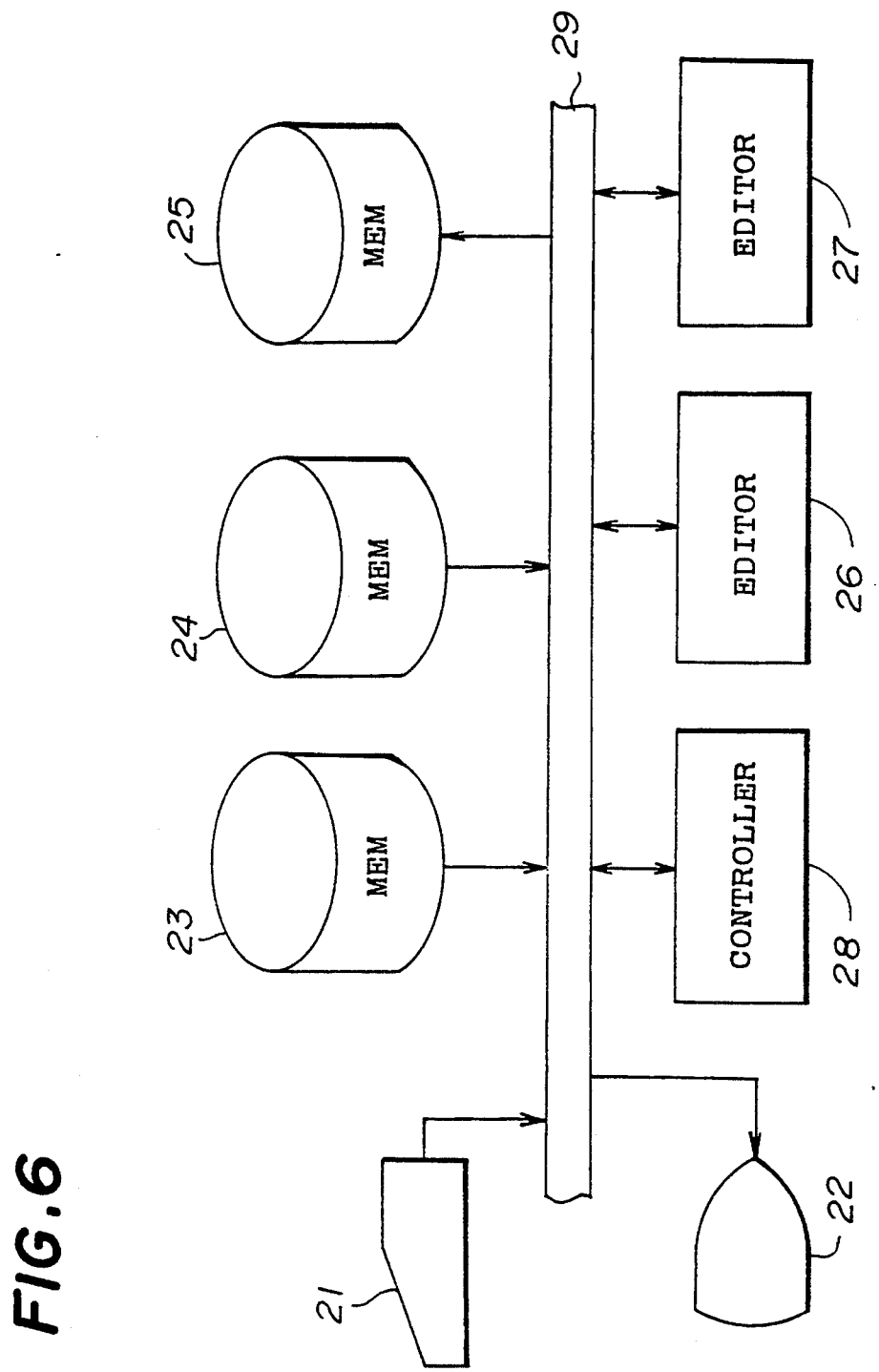
FIG. 6 is a system block diagram showing an automatic data forming and processing system.

FIG. 6 shows an automatic data forming (i.e., organizing) and processing system which employs the embodiment of the exposure data forming method. A keyboard 21 is used to input data for controlling the process of arranging the non-compressed exposure pattern PA and the compressed exposure pattern PB which are specified by an input data card, for example. A display device 22 displays a memory layout pattern or the like in which the compressed exposure pattern PB is arranged within the non-compressed exposure pattern PA.

For example, a design data file memory 23 stores compressed exposure data related to a memory cell which is made up of a repetition of basic patterns and non-compressed exposure data related to a peripheral circuit made up of non-repeating patterns. A data temporary file memory 24 temporarily stores exposure data and the like together with respective, individual numbers which are assigned to the unit deflection regions of the compressed and non-compressed exposure patterns and the extracting reference numbers indicative of the order in which the individual numbers are extracted, when carrying out a process such as assigning the individual numbers and assigning the exposing order in which the regions are to be exposed. An exposure data file 25 stores exposure data which is related to the memory device and is subjected to the process of assigning the exposing order.

A pattern arrangement processing editor 26 processes the arrangement of the non-compressed exposure pattern PA and the compressed exposure pattern PB. A hierarchical development processing editor 27 carries out a hierarchical development process on the data related to the non-compressed exposure pattern PA and the compressed exposure pattern PB. The hierarchical development process does not process the arrangement information related to each pattern, but processes compressed arrangement information describing the patterns in terms of "a starting point", "a pitch" and "a number in the arrangement" of a basic block.

An automatic data forming controller 28 controls input and output of the keyboard 21, the display device 22, the memories 23 through 25, and the processing editors 26 and 27 which are coupled to the automatic data forming controller 28 via a system bus 29.

The automatic data forming and processing system having the above described construction automatically forms the exposure data PD in which the compressed exposure pattern PB is synthesized within the non-compressed exposure pattern PA.

Next, a description will be given of a method of automatically forming the exposure data related to the memory device having a memory capacity on the order of several Mbits, using the automatic data forming and processing system.

Figure 7A:
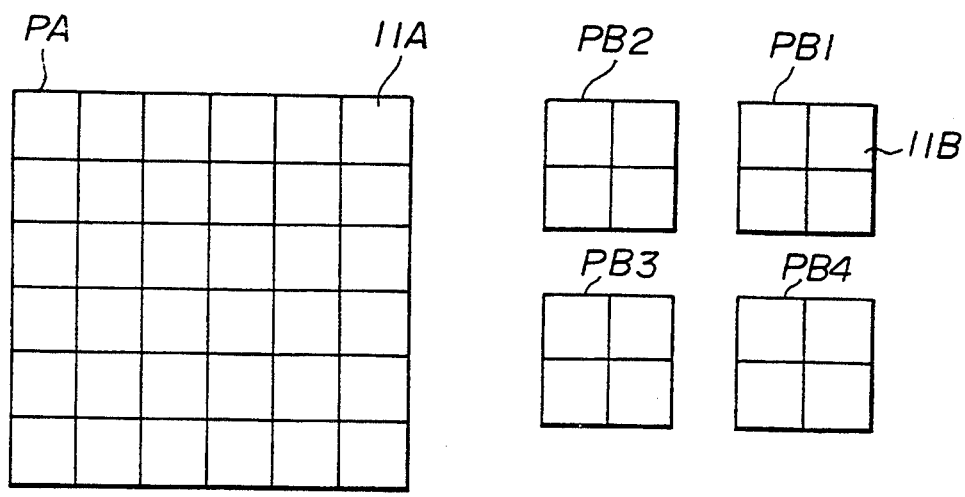
FIGS. 7A, 7B, 7C and 7D are diagrams for explaining an embodiment of the exposure data forming method according to the present invention.

FIGS. 7A through 7D are diagrams for explaining an embodiment of the exposure data forming method according to the present invention. FIG. 7A shows a non-compressed exposure pattern PA in which the unit deflection regions 11A are defined, and the compressed exposure pattern PB in which the unit deflection regions 11B are defined.

In FIG. 7A, the non-compressed exposure pattern PA and the compressed exposure pattern PB, which are to be used for the memory device and automatically formed by the automatic data forming and processing system, are determined. In this embodiment, the compressed exposure pattern PB is used for the memory cell which is made up of a repetition of basic patterns. For example, four compressed exposure patterns PB1 through PB4 form the memory cell. In addition, the non-compressed exposure pattern PA is used for the peripheral circuit which is made up of non-repeating patterns. It is assumed for the sake of convenience that the four compressed exposure patterns PB1 through PB4 are arranged at the center of the non-compressed exposure pattern PA.

The unit deflection regions 11A and 11B respectively will be defined as regions in which the charged particle beam or the like can be deflected by a maximum deflection quantity by the deflector of the exposure apparatus.

Figure 7B:
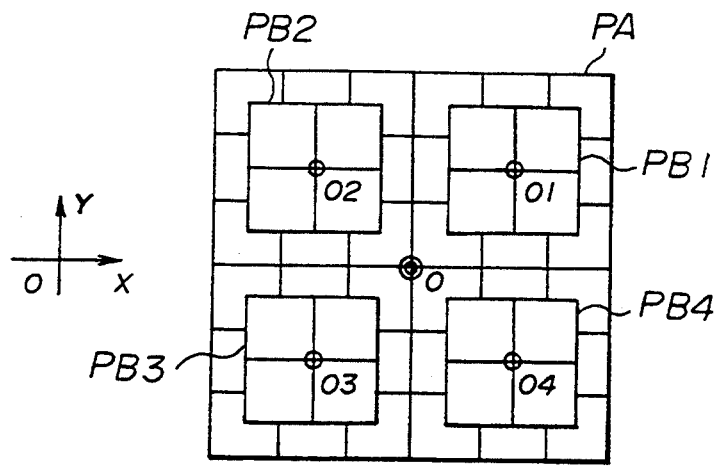

The compressed exposure pattern PB is arranged within the non-compressed exposure pattern PA in FIG. 7B by an arranging process. Using the pattern arrangement processing editor 26 of the automatic pattern forming and processing system, an origin O1 of the compressed exposure pattern PB1 is aligned to a coordinate (x, y), an origin O2 of the compressed exposure pattern PB2 is aligned to a coordinate (−x, y), an origin O3 of the compressed exposure pattern PB3 is aligned to a coordinate (−x, −y) and an origin O4 of the compressed exposure pattern PB4 is aligned to a coordinate (x, −y), taken with reference to an origin O (0, 0) of the non-compressed exposure pattern PA.

Next, a number is individually assigned to each of the unit deflection regions 11A and 11B by a numbering process, and the result of this numbering process is temporarily stored in the memory 24. The numbering process assigns sequential numbers which increase monotonously from the data origin along the Y-axis direction on the coordinate system. In addition, when a starting point is set on the negative side of the Y-coordinate, the numbering process assigns the sequential numbers so that all of the deflection regions are covered from left to right and vice versa every time the value of the Y-coordinate changes.

Accordingly, the individual numbers "1" through "4" are assigned counterclockwise to the unit deflection regions 11B of the compressed exposure pattern PB3. Similarly, the individual numbers "5" through "8" are assigned to the unit deflection regions 11B of the compressed exposure pattern PB4, the individual numbers "9" through "12" are assigned to the unit deflection regions 11B of the compressed exposure pattern PB1, and the individual numbers "13" through "16" are assigned to the unit deflection regions 11B of the compressed exposure pattern PB2.

In addition, the individual numbers "17" through "48" are assigned to each of the unit deflection regions 11A of the non-compressed exposure pattern PA starting from the starting point and scanning alternately from left to right and vice versa relative to the x-axis, in successive scans displaced along the Y-axis.

Figure 7C:
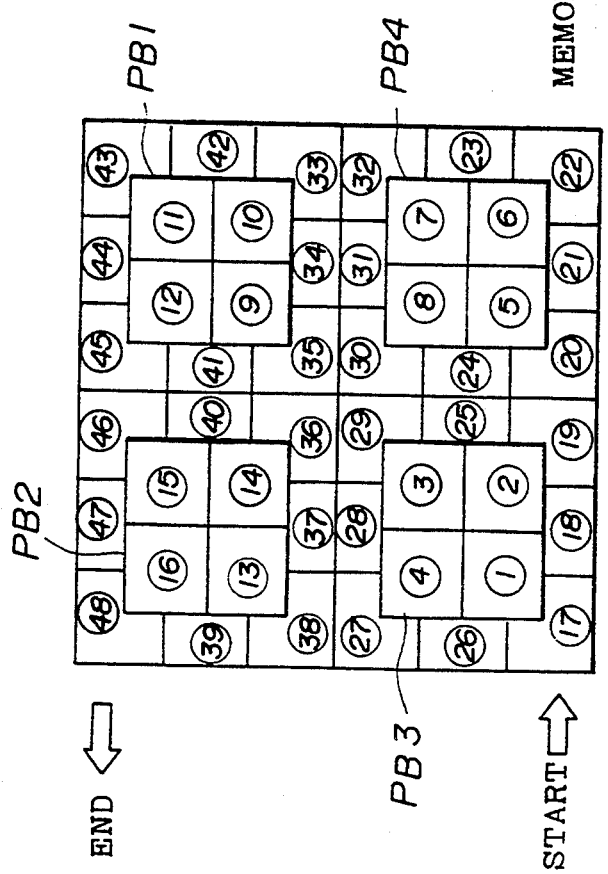

Next, the exposing order is assigned to the unit deflection regions 11A and 11B of the non-compressed and compressed exposure patterns PA and PB respectively numbered "1" to "48" as described above. The individual numbers "1" to "48" of the respective unit deflection regions 11A and 11B are extracted according to extracting reference numbers '1' to '48', for example, and the extracted individual numbers "1" to "48" are developed in a memory table within the memory 24 as shown in FIG. 7C. This extracting process is carried out based on deferring the sequential order of scanning the unit deflection regions 11A and 11B of the non-compressed and compressed exposure patterns PA and PB whereby successively scanned units are connected through a shortest path. In this embodiment, the individual number "17" is extracted for the extracting reference number '1'. Similarly, the individual number "18" is extracted for the extracting reference number '2' the individual number "19" is extracted for the extracting reference number '3', the individual number "20" is extracted for the extracting reference number '4', . . .

Figure 7D:
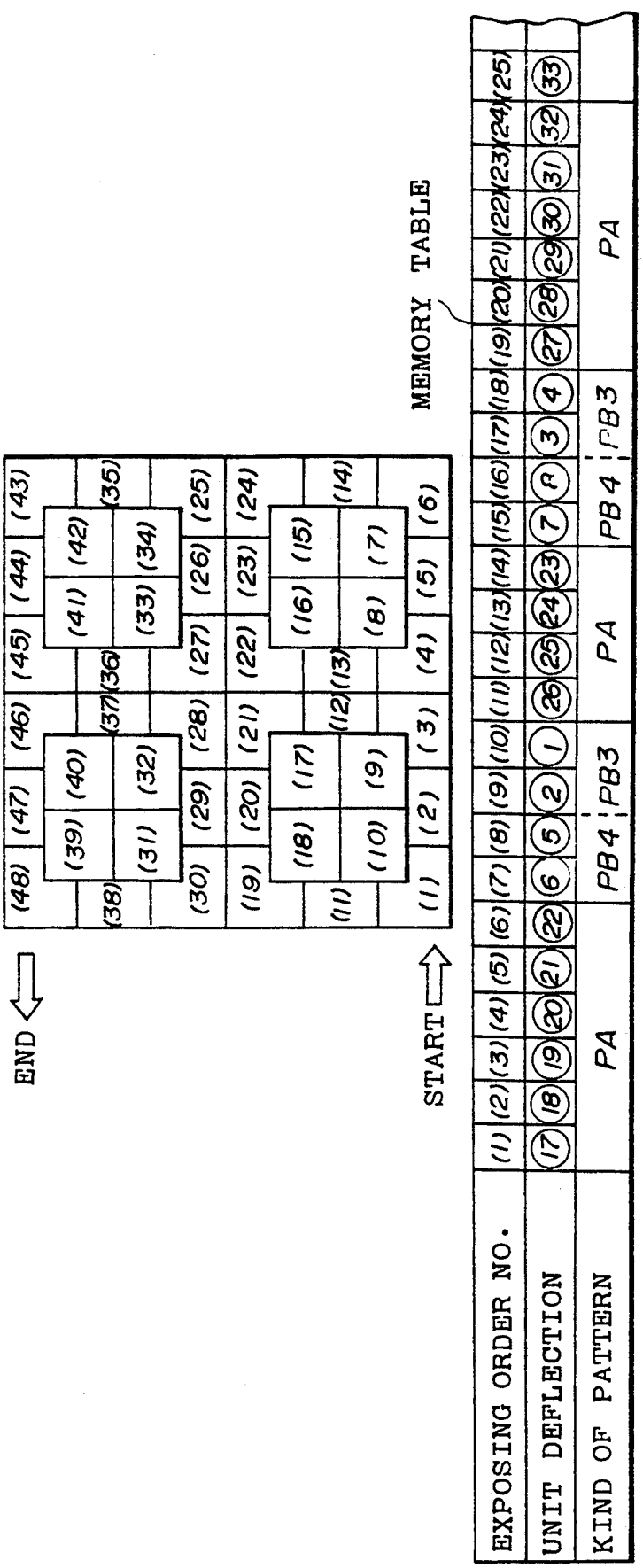

Furthermore, in FIG. 7D, the exposing order of the unit deflection regions 11A and 11B, as established by the process of assigning the exposing order, is partially corrected. This correction process is carried out with respect to the individual numbers "17", "18" . . . by comparing the size of the path along the Y-axis for a given X-axis position with the size of the path along the X-axis for a given Y-axis position. For example, and as shown in FIG. 7D, by comparison with FIG. 7C, the exposing order is corrected for the unit deflection regions 11B of the compressed exposure patterns PB3 and PB4 (see, FIG. 7B). As a result, the corrected extracting reference numbers '1' to '48' assigned to the respective individual numbers "17", "18", . . . , "6", "5", . . . , . . . , "48" of the unit deflection regions 11A and 11B as shown in FIG. 7D are taken as the exposing order (1) to (48) when carrying out the exposure process the exposing order defining a zigzag scan path for the exposure of the entire region, as explained in more detail, below.

According to this embodiment of the exposure data forming method, the exposing order of the unit deflection regions 11A and 11B shown in FIG. 7D is defined by the corrected extracting reference numbers assigned to the individual numbers "1" to "48" which, in turn, are assigned to the respective unit deflection regions 11A and 11B of the non-compressed and compressed exposure patterns PA and PB. Hence, the process of extracting the individual numbers "1" to "48" of the unit deflection regions 11A and 11B can be carried out, based on the order which connects the unit deflection regions 11A and 11B of the non-compressed and compressed exposure patterns PA and PB through the shortest path. Therefore, the process of rearranging the data related to the exposure pattern, such that the compressed exposure pattern PB is synthesized within the non-compressed exposure pattern PA, can be carried out with ease.

In other words, the exposure data PD which is generated is used for making a zigzag exposure of the entire region starting from the arbitrary unit deflection region 11A of the non-compressed exposure pattern PA having the individual number "17" to the unit deflection region 11A of the non-compressed exposure pattern PA having the individual number "48", and encompassing therewith the unit deflection regions 11B of the compressed exposure pattern PB respectively having the individual numbers "1" through "16".

Figure 8:
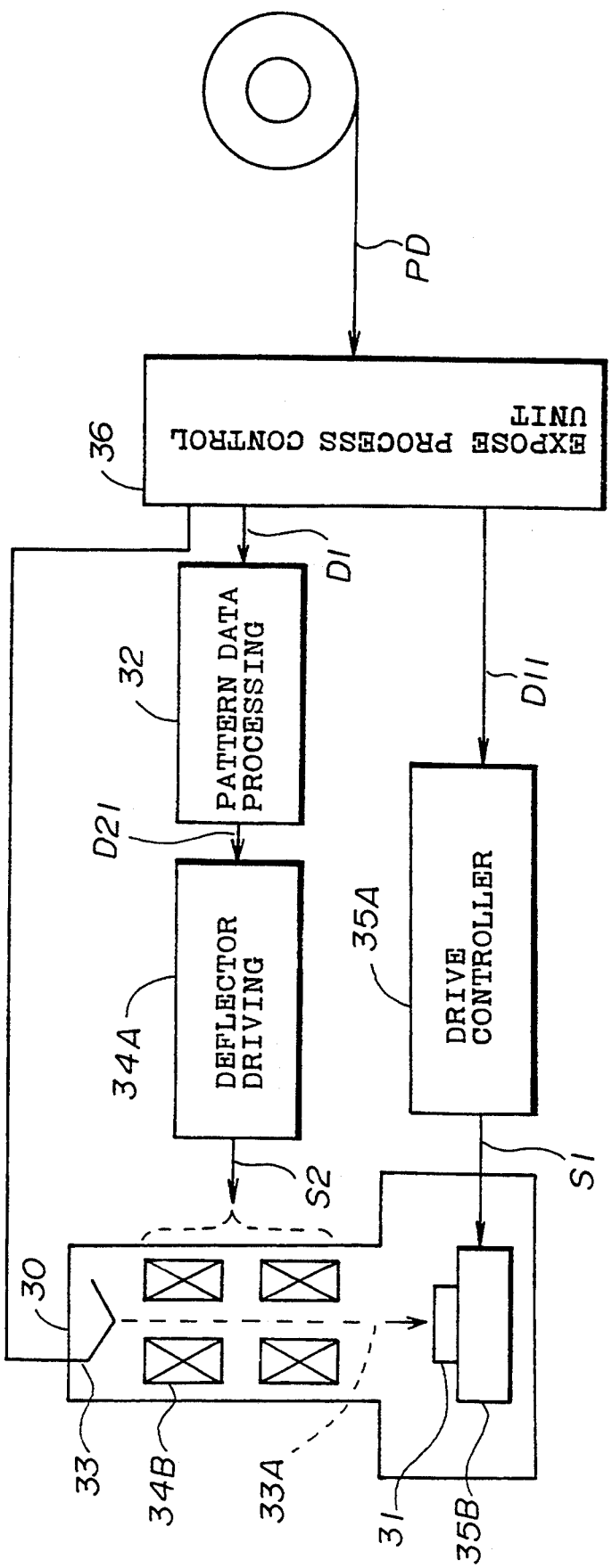
FIG. 8 is a system block diagram generally showing an electron beam exposure apparatus.

FIG. 8 generally shows the electron beam exposure apparatus to which the embodiment of the pattern exposure apparatus may be applied. This electron beam exposure apparatus exposes an LSI pattern in which the compressed exposure pattern PB is synthesized within the non-compressed exposure pattern PA.

In FIG. 8, an electron gun 33 corresponds to the charged particle beam generating source 13 shown in FIG. 4, and irradiates an electron beam 33A on a semiconductor wafer 31 which corresponds to the object 11. A pattern data processing circuit 32 corresponds to the exposure data processor 12, and outputs deflection data D21 in response to pattern exposure data PD1.

A deflector driving circuit 34A forms a part of the deflector 14 (i.e., in FIG. 4), and controls a plurality of deflectors 34B within a mirror cylinder 30 responsive to the deflection data D21. Each deflector 34B includes an electromagnetic coil, a static deflector and the like for deflecting the electron beam 33A. A drive controller 35A forms a part of the moving mechanism 15, and supplies a drive control signal S1 to an XY stage 35B in response to motion control data D11. The XY stage 35B carries the semiconductor wafer 31 and moves depending on the drive control signal S1.

An exposure process control unit 36 corresponds to the controller 16 of FIG. 4. The exposure process control unit 36 outputs the pattern exposure data PD1 and the motion control data D11 based on the exposure data PD which is generated by the embodiment of the exposure data forming method described above, and also controls the input to, and thus the output of, the electron gun 33.

First, the exposure data PD for the semiconductor wafer 31 is input to the exposure process control unit 36, and the exposure process control Unit 36 supplies the pattern exposure data PD1 to the pattern data processing circuit 32. In addition, the exposure process control unit 36 supplies the motion control data D11 to the drive controller 35A. On the other hand, the electron beam 33A emitted from the electron gun 33 is irradiated on the semiconductor wafer 31. The electron beam 33A is deflected by the deflectors 34B which are controlled by the deflector driving circuit 34A based on the deflection data D21, and scans the semiconductor wafer 31.

The XY stage 35B is moved, based on the motion control data D11. The XY stage 35B is moved so that the entire region of the semiconductor wafer 31 is covered by the zigzag scan of the electron beam 33A, starting from an arbitrary unit deflection region 11A of the non-compressed exposure pattern PA and proceeding to another arbitrary unit deflection region 11A of the non-compressed exposure pattern PA, including therewithin the unit deflection regions 11B of the compressed exposure pattern PB. Accordingly, the compressed exposure pattern can be exposed within the time of exposing the non-compressed exposure pattern and while the XY stage undergoes the zigzag movement.

Figure 9:
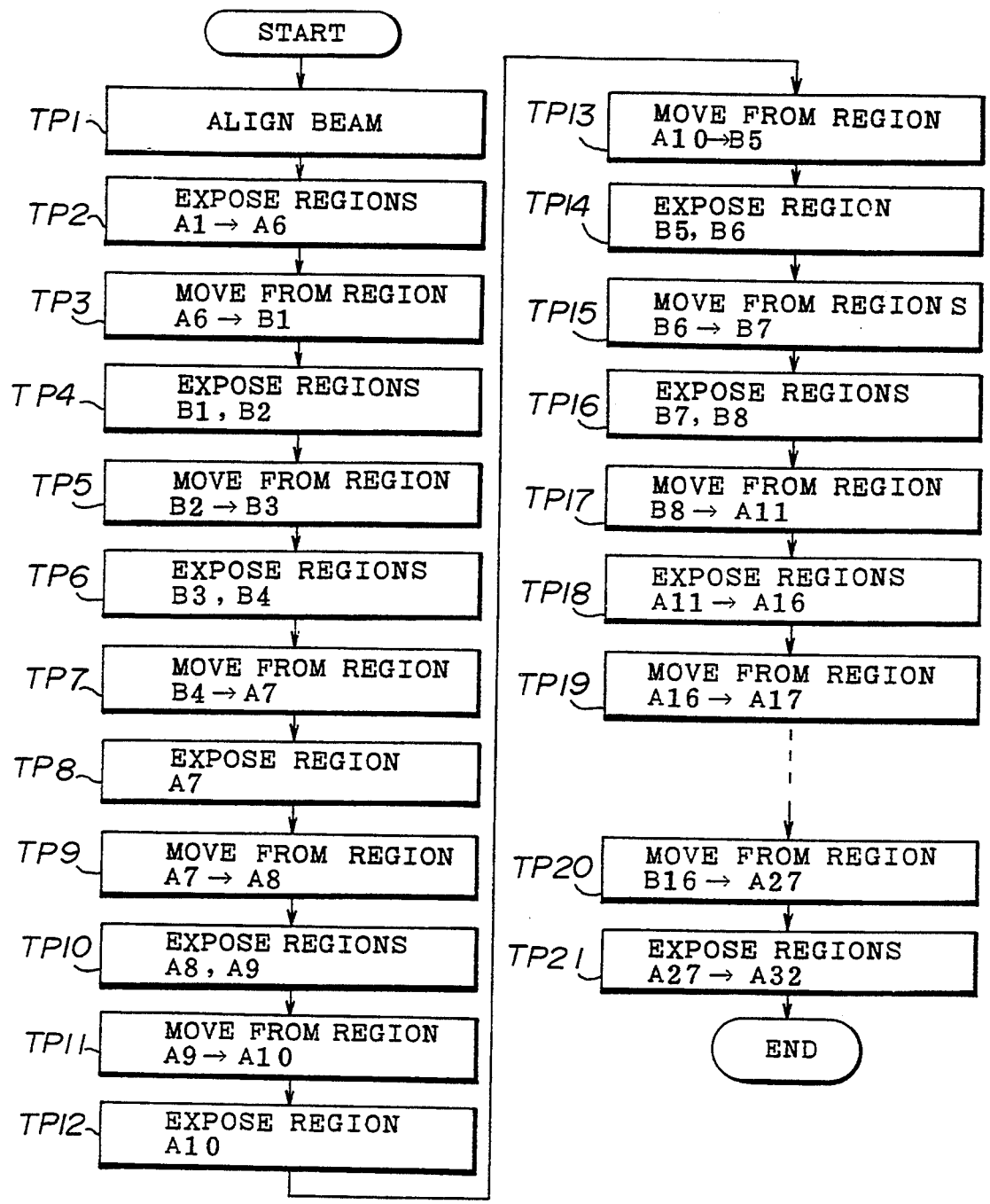
FIG. 9 is a flow chart for explaining an embodiment of the pattern exposure method according to the present invention.
Figure 10:
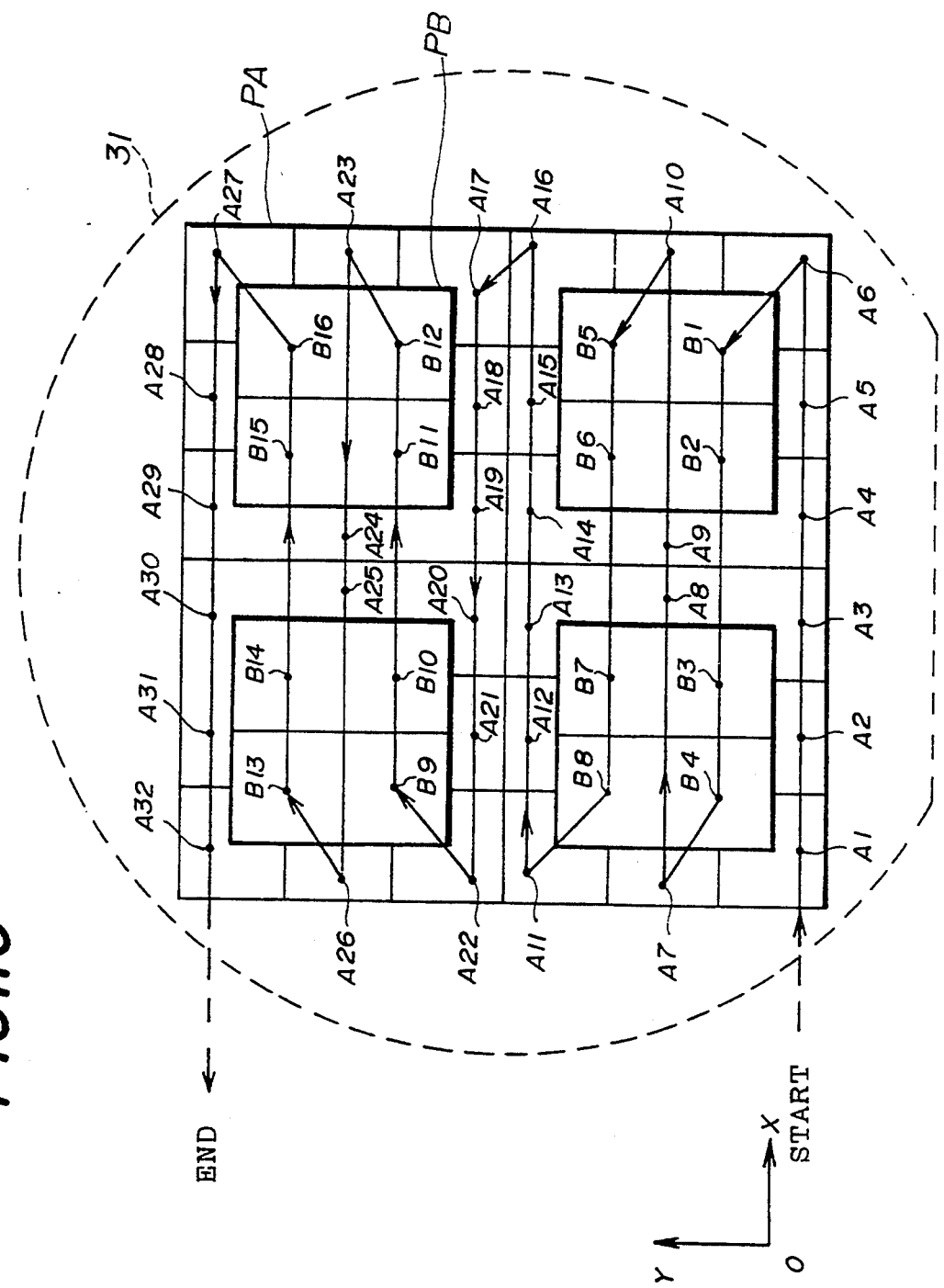
FIG. 10 is a diagram for explaining a scanning locus of an electron beam.

FIG. 9 is a flow chart for explaining the embodiment of the pattern exposure method according to the present invention, and FIG. 10 is a diagram for assisting in the description of the flow chart.

In FIG. 9, it will be assumed for the sake of convenience that the pattern of a memory device is exposed on the semiconductor wafer 31 based on the exposure data PD in which the compressed exposure pattern PB is synthesized within the non-compressed exposure pattern PA. First, a step TP1 aligns the position of the electron beam 33A.

In FIG. 10, A1 through A32 denote first unit exposure regions in which the non-compressed exposure pattern PA is exposed. In addition, B1 through B16 denote second unit exposure regions in which the compressed exposure pattern PB is exposed. In this embodiment, the step TP1 aligns the position of the electron beam 33A with the unit exposure region A1 by the deflector 34B.

Then, a step TP2 carries out the exposure process from the region A1 to the region A6. A first exposure is made during this time to expose the non-compressed exposure pattern PA of the peripheral circuit or the like of the memory device. In addition, the XY stage 35B is moved in the X-axis direction based on the motion control data D11.

A step TP3 moves the XY stage 35B so as to change the region to be exposed from the region A6 to the region B1. The XY stage 35B is moved in the X-axis and Y-axis directions during a corresponding blanking period of the electron beam 33A. Thereafter, a step TP4 carries out the exposure process with respect to the regions B1 and B2. A second exposure is made during this time to expose the compressed exposure pattern PB of the memory cell or the like of the memory device, that is, to expose the repeating patterns.

Next, a step TP5 moves the XY stage 35B so as to change the region to be exposed from the region B2 to the region B3. Similarly as described above, the XY stage 35B is moved in the X-axis direction during a corresponding blanking period of the electron beam 33A. Thereafter, a step TP6 carries out the exposure process with respect to the regions B3 and B4.

A step TP7 moves the XY stage 35B so as to change the region to be exposed from the region B4 to the region A7. In this case, the XY stage 35B is moved in the X-axis and Y-axis directions during a corresponding blanking period of the electron beam 33A. A step TP8 makes a first exposure to expose the region A7.

A step TP9 moves the XY stage 35B so as to change the region to be exposed from the region A7 to the region A8. The XY stage 35B is moved in the X-axis direction during a corresponding blanking period of the electron beam 33A, and a step TP10 makes a first exposure to expose the regions A8 and A9.

Next, a step TP11 moves the XY stage 35B so as to change the region to be exposed from the region A9 to the region A10. Similarly as described above, the XY stage 35B is moved in the X-axis direction during a corresponding blanking period of the electron beam 33A. Thereafter, a step TP12 makes a first exposure to expose the region A10.

In addition, a step TP13 moves the XY stage 35B to change the region to be exposed from the region A10 to the region B5. The XY stage 35B is moved in the X-axis direction during a corresponding blanking period of the electron beam 33A, and a step TP14 makes a second exposure to expose the regions B5 and B6.

Next, a step TP15 moves the XY stage 35B so as to change the region to be exposed from the region B6 to the region B7. Similarly as described above, the XY stage 35B is moved in the X-axis direction during a corresponding blanking period of the electron beam 33A, and a step TP16 thereafter makes a second exposure to expose the regions B7 and B8.

A step TP17 moves the XY stage 35B so as to change the region to be exposed from the region B8 to the region A11. The XY stage 35B is moved in the X-axis and Y-axis directions during a corresponding blanking period of the electron beam 33A, and a step TP18 makes a first exposure to expose the regions A11 through A16.

Then, a step TP19 moves the XY stage 35B so as to change the region to be exposed from the region A16 to the region A17. The XY stage 35B is moved in the X-axis and Y-axis directions during a corresponding blanking period of the electron beam 33A. As a result, the lower half of the semiconductor wafer 31 is exposed. Thereafter, the upper half of the semiconductor wafer 31 is exposed similarly by steps TP20 and TP21 which follow the step TP19.

Therefore, it is possible to expose the pattern of the memory device on the semiconductor wafer 31.

According to this embodiment of the pattern exposing method of the present invention, the first and second exposures are mixed in the exposure process. For this reason, the semiconductor waver 31 including the first unit exposure regions A1 through A32 and the second unit exposure regions B1 through B16 is exposed by the zigzag scan, using the unit exposure region A1 of the non-compressed exposure pattern PA as the reference point. The non-compressed exposure pattern PA is exposed in the first unit exposure regions A1 through A32, and the compressed exposure pattern PB is exposed in the second unit exposure regions B1 through B16. Consequently, the XY stage 35B which carries the semiconductor wafer 31 need not make the unnecessary moves as are made in the case of the conventional method, and the XY stage 35B is moved efficiently. As a result, the exposure time as a whole is reduced by this embodiment.

Figure 11:
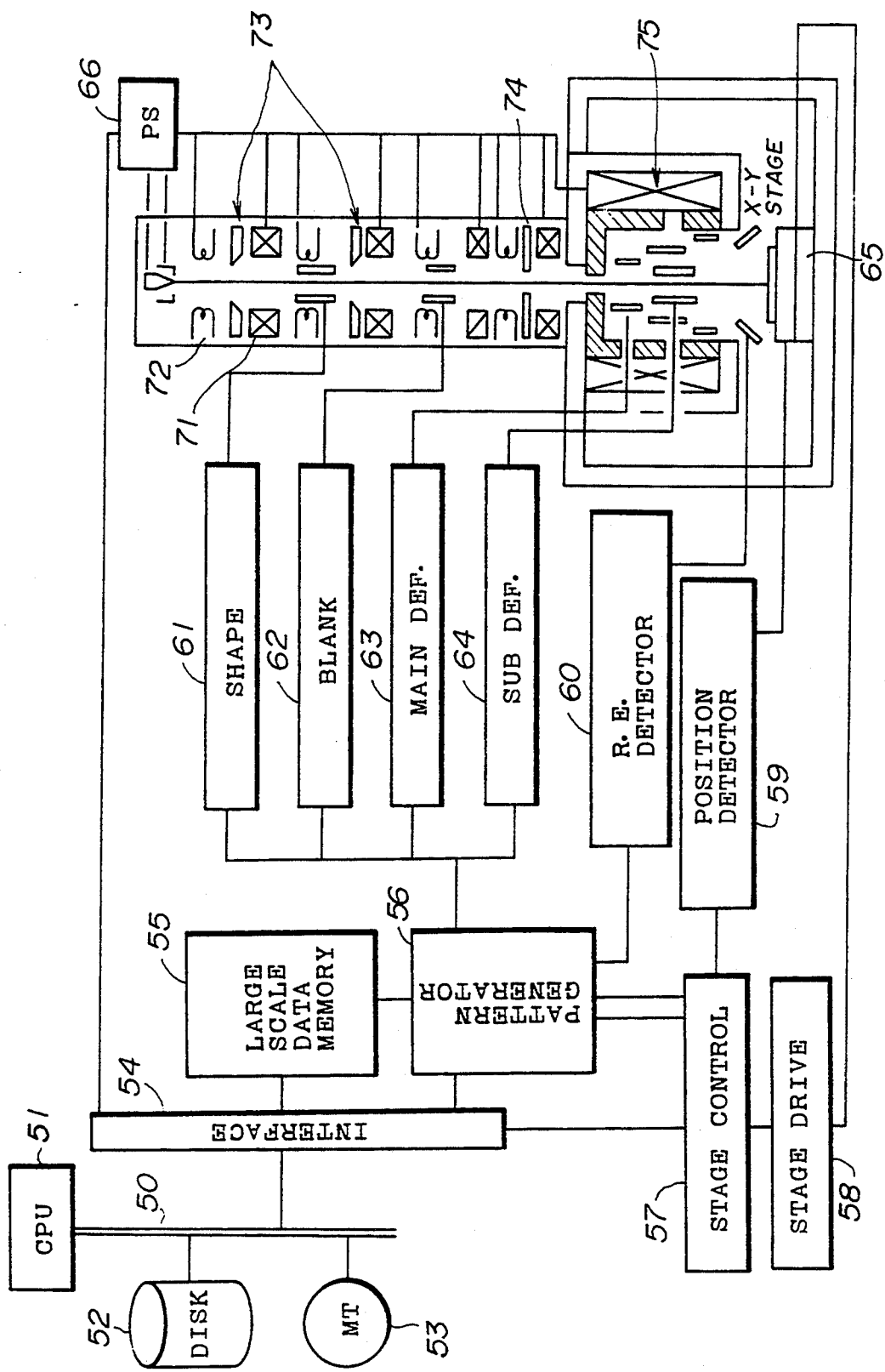
FIG. 11 shows the electron beam exposure apparatus in more detail.

Next, a description will be given of an embodiment of a system which performs the pattern forming method according to the present invention, by referring to FIGS. 11 and 12. FIG. 11 shows the electron beam exposure apparatus in more detail, and FIGS. 12A through 12E show successive structures produced in the successive pattern forming steps. In this embodiment, the exposure data formed by the exposure data forming method of the present invention is used, and the exposure is made using the pattern exposure method and apparatus according to the present invention.

In FIG. 11, a central processing unit (CPU) 51, a disk unit 52 which has a disk and a magnetic tape unit 53 which has a magnetic tape are coupled to the CPU 51 via a bus 50. An interface 54 couples a large scale data memory 55, a pattern generator 56, a stage controller 57 and a power supply unit 66 to the bus 50. The disk unit 52 and/or the magnetic tape unit 53 store the exposure data PD described above. The memory 55 and the pattern generator 56 correspond to the exposure data processor 12 shown in FIG. 4. The CPU 51 corresponds to the controller 16 of FIG. 4.

The stage controller 57 controls a stage driver 58 based on the scan data D2 output from the pattern generator 56 and a position detection signal output from a position detector 59 which detects the position of an XY stage 65. Hence, the stage driver 58 moves the XY stage 65 under the control of the stage controller 57. The stage driver 58 and the XY stage 65 correspond to the moving mechanism 15. A reflected electron detector 60 detects the reflected electron beam and supplies a detection signal to the pattern generator 56.

The power supply 66 supplies power to lens coils 71 and alignment coils 72 which are responsive to outputs of a shaping circuit 61 and a blanking circuit 62. The electron beam is aligned and shaped by shaping apertures 73 and a final aperture 74. A main deflecting circuit 63 and a sub deflecting circuit 64 control projection lens coils 75 to deflect the electron beam respectively in the main and sub directions. The circuits 61 through 64 are controlled, based on an output of the pattern generator 56. The circuits 61 through 64 and the coils 71, 72 and 75 correspond to the deflector 14.

Figure 12A:
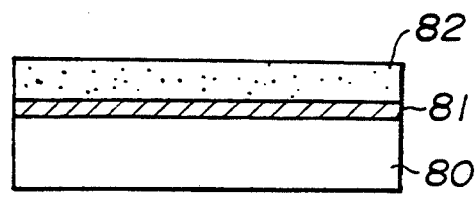
FIGS. 12A, 12B, 12C, 12D and 12E are cross sectional views for explaining an embodiment of a pattern forming method according to the present invention.

In this embodiment of a system for performing the pattern forming method, a pattern is formed on a substrate 80 shown in FIG. 12A. For example, the substrate 80 is made of glass, quartz and the like. This substrate 80 is carried on the XY stage 65 shown in FIG. 11. A metal layer 81 is formed on the substrate 80, and a resist layer 82 is formed on the metal layer 81. For example, the metal layer 81 is made of Cr, $Cr_xO_y$ and the like. Negative resist materials which may be used for the resist layer 82 include CMS-EX manufactured by TOSOH and SAL manufactured by SHIPLEY. On the other hand, positive resist materials which may be used for the resist layer 82 include EBR-9 manufactured by TORAY and ZEP manufactured by NIPPON ZEON. For the sake of convenience, it is assumed that the resist layer 82 is made of a negative resist material.

Figure 12B:
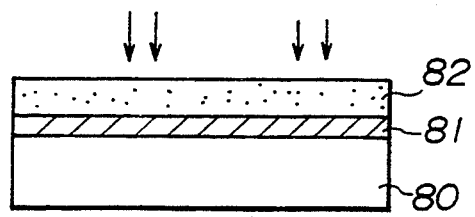
Figure 12C:
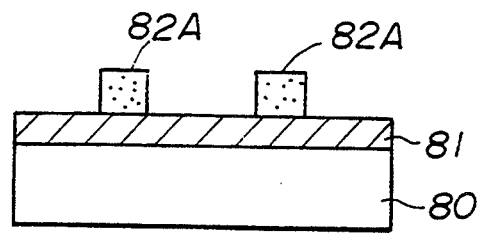
Figure 12D:
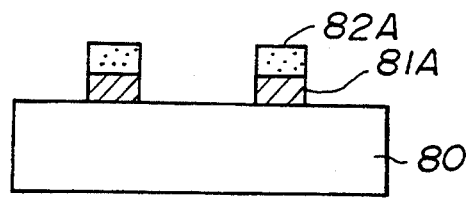

In FIG. 12B, the resist layer 82 is exposed by the electron beam by the pattern exposure method described above, using the electron beam exposure apparatus shown in FIG. 11. By developing the exposed resist layer 82, patterns 82A of the resist layer 82 remain as shown in FIG. 12C. The remaining patterns 82A are used as a mask to etch the metal layer 81 by a dry etching process, for example. As a result, the metal layer 81 is removed at parts other than the parts covered by the patterns 82A, thereby forming patterns 81A of the metal layer 81. Finally, the remaining patterns 82A are removed by a dry ashing, for example, so that only the patterns 81A of the metal layer 81 remains on the substrate 80 as shown in FIG. 12E.

Figure 12E:
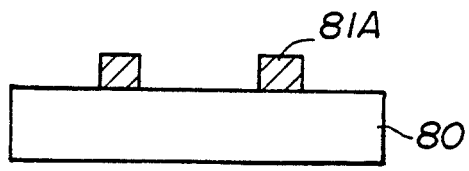

The structure including the patterns 81A shown in FIG. 12E may be a mask, a reticle or a semiconductor device itself. The mask or reticle which is produced in this embodiment may be used to expose patterns on a semiconductor wafer using the pattern exposure method and apparatus according to the present invention. On the other hand, the semiconductor device which is produced in this embodiment is realized by directly drawing the patterns on the semiconductor wafer by a charged particle beam such as an electron beam.

In the embodiments described above, the present invention is applied to the electron beam exposure apparatus. However, the present invention is similarly applicable to various types of exposure apparatuses including charged particle beam exposure apparatuses other than the electron beam exposure apparatus and exposure apparatuses using ultraviolet light or X-ray.

Further, the present invention is not limited to these embodiments, but various variations and modifications may be made without departing from the scope of the present invention.

What is claimed is:

1. An exposure data organizing method for organizing exposure data defining a composite pattern to be exposed on a corresponding region of an object by an exposure beam in an exposure apparatus and wherein the composite pattern comprises at least one compressed, repeating exposure pattern and a non-compressed, non-repeating exposure pattern, each of the compressed repeating and non-compressed, non-repeating exposure patterns comprising plural, predefined unit deflection regions and each unit deflection region being defined as a region in which the exposure beam can be deflected by a maximum beam deflection amount and to which a corresponding portion of the exposure data relates, comprising the steps of:
   (a) arranging each compressed, repeating exposure pattern relatively to the non-compressed and non-repeating exposure pattern in accordance with the composite pattern;
   (b) assigning respective, individual identifying numbers to the respective unit deflection regions of the arranged, non-compressed and non-repeating, and compressed and repeating exposure patterns;
   (c) assigning respective exposure order numbers to the unit deflection regions defining a sequential order of exposure of the respective unit deflection regions, the sequence being determined in accordance with minimizing the length of a path through which the exposure beam is deflected when proceeding from the exposure of one unit deflection region to the exposure of a next successive unit deflection region, for all of the unit deflection regions of all of the arranged exposure patterns; and
   (d) processing the exposure data for the object by correlating the respective exposure data portions of the unit deflection regions, as identified by the respective, individual identifying numbers assigned thereto, in accordance with the respective exposure order numbers assigned to the unit deflection regions.

2. The exposure data organizing method as recited in claim 1, wherein the sequence is determined in accordance with deflecting the exposure beam along a zigzag scanning locus which connects each unit deflection region with the next successive unit deflection region through the minimum path length therebetween.

3. The exposure data organizing method as recited in claim 1, wherein each of said steps (a) through (d) is implemented and carried out in a computer.

4. A pattern exposure method for exposing a composite pattern on a region of an object by an exposure beam in an exposure apparatus and in accordance with exposure pattern data, the composite pattern comprising a relative arrangement of at least one compressed, repeating exposure pattern and a non-compressed, non-repeating exposure pattern respectively defined by corresponding compressed, repeating exposure pattern data and corresponding non-compressed, non-repeating exposure pattern data, each of the compressed, repeating and non-compressed, non-repeating exposure patterns comprising plural predefined unit deflection regions and each unit deflection region being defined as a region in which the exposure beam can be deflected by a maximum beam non-repeating amount and to which a corresponding portion of the exposure data relates, comprising the steps of:
   (a) organizing the exposure pattern data so as to merge the exposure pattern data corresponding to the at least one compressed, repeating exposure pattern with the exposure pattern data corresponding to each non-compressed, non-repeating exposure pattern in accordance with the relative arrangement of each compressed, repeating exposure pattern with the non-compressed, non-repeating exposure pattern in the composite pattern;
   (b) defining a zigzag scanning locus which determines the order in which the respective unit deflection regions of the relatively arranged, at least one compressed, repeating exposure pattern and the non-compressed, non-repeating exposure pattern of the composite pattern are to be scanned, the zigzag scanning locus being defined in accordance with defining a path of minimum length through which the exposure beam is deflected when proceeding from each unit deflection region, which has been scanned and thereby exposed in accordance with the respective portion of the corresponding exposure data, to a next successive unit deflection region, which is to be scanned and thereby exposed in accordance with the respective portion of the corresponding exposure data, for all of the unit deflection regions of the relatively arranged patterns of the composite pattern; and (c) successively scanning and thereby exposing the unit deflection regions in accordance with the respective portions of the corresponding exposure data and in the order defined by the zigzag scanning locus and deflecting the exposure beam through each said path of minimum length interconnecting a scanned unit deflection region with a next successive unit deflection region to be scanned by maintaining the exposure beam in a stationary position relative to the exposure apparatus and moving the object relatively to the stationary position of the exposure beam and thus relatively to the exposure apparatus.

5. A pattern exposure method as recited in claim 4, further comprising:

defining, arbitrarily, an XY coordinate system of transverse X- and Y axes relative to the region of the object on which the composite pattern is to be exposed, the composite pattern having a width along the X-axis and a height along the Y-axis; and defining the zigzag scanning locus so as to include successive, minimum length paths progressing along the X-axis, for the width of the composite pattern, in an alternating succession of positive and negative, and thus opposite directions along the X-axis at corresponding and successive Y-axis positions, determined by successive, minimum length parts progressing in a positive direction along the Y-axis for the height of the complex pattern, and so as to include a minimum length path along the Y-axis intermediate and interconnecting the successive, alternate and opposite minimum paths in the X-axis direction.

6. A pattern exposure method as recited in claim 5, further comprising:

defining a center of each unit deflection region; and defining the zigzag scanning locus so as to pass through the center of each unit deflection region.

7. A pattern exposure apparatus comprising:

exposure data processing means for producing deflection data and scan data in response to exposure data related to patterns which are to be exposed on an object;

generating means for generating a charged particle beam which irradiates the object;

deflector means, coupled to said exposure data processing means and responsive to the deflection data, for deflecting the charged particle beam in accordance with the deflection data;

moving means, coupled to said exposure data processing means, for carrying and moving the object relatively to the exposure beam, based on the scan data;

control means coupled to and for controlling the input and the output of said exposure data processing means, said generating means, said deflector means and said moving means, said exposure data including data related to at least a non-compressed and non-repeating exposure pattern and a compressed, repeating exposure pattern, corresponding unit deflection regions being predefined for each exposure pattern and each unit deflection region being a region in which the charged particle beam can be deflected by said deflector means by a maximum deflection amount; and said control means, in response to said scan data and in accordance with a zigzag scanning locus defining the order of scanning of the unit deflection regions whereby each scanned unit deflection region is connected through a path of a minimum length to the next successive unit deflection region to be scanned, controlling said moving means for moving the object relative to the exposure beam thereby for positioning a selected unit deflection region for scanning, by the charged particle beam of the deflector means and in accordance with the deflection data relating to the positioned unit deflection region, and for moving the object relative to the exposure beam for positioning each next successive unit deflection region for scanning thereof by the charged particle beam of the deflector means and in accordance with the deflection data related to each said next successive unit deflection region, in the order thereof as defined by the zigzag scanning locus.

8. A pattern exposure apparatus as recited in claim 7, wherein the control means determines the zigzag scanning locus in accordance with:

defining, arbitrarily, an XY coordinate system of transverse X and Y axes relative to the region of the object on which the composite pattern is to be exposed, the composite pattern having a width along the X-axis and a height along the Y-axis; and defining the zigzag scanning locus so as to include successive, minimum length paths progressing along the X-axis, for the width of the composite pattern, in an alternating succession of positive and negative, and thus opposite, directions along the X-axis at corresponding and successive Y-axis positions, determined by successive, minimum length parts progressing in a positive direction along the Y-axis for the height of the complex pattern, and so as to include a minimum length path along the Y-axis intermediate and interconnecting the successive, alternate and opposite minimum paths in the X-axis direction.

9. A pattern exposure apparatus as recited in claim 7, wherein the control means further determines the zigzag scanning locus in accordance with:

defining a center of each unit deflection region; and defining a zigzag scanning locus so to pass through the center of each unit deflection region.

10. A pattern forming method for forming patterns on a main surface of a substrate structure, which main surface is exposed by scanning by an exposure beam in an exposure apparatus and in accordance with exposure pattern data, the composite pattern comprising a relative arrangement of at least one compressed, repeating exposure pattern and a non-compressed, non-repeating exposure pattern, respectively defined by corresponding compressed, repeating exposure pattern data and corresponding non-compressed, non-repeating exposure pattern data, each of the compressed, repeating and non-compressed, non-repeating exposure patterns comprising plural predefined unit deflection regions and each unit deflection region being defined as a region in which the exposure beam can be deflected by a maximum beam deflection amount and to each of which a respective portion of the corresponding exposure pattern data relates, said substrate structure including a substrate having a main surface, a pattern layer formed on the main surface of the substrate and a resist layer formed on the pattern layer, said pattern forming method comprising the steps of:

(a) organizing the exposure pattern data so as to merge the exposure pattern data corresponding to the at least one compressed, repeating exposure pattern with the exposure pattern data corresponding to each non-compressed, non-repeating exposure pattern in accordance with the relative arrangement of each compressed, repeating exposure pattern with the non-compressed, non-repeating exposure pattern in the composite pattern;

(b) defining a zigzag scanning locus which determines the order in which the respective unit deflection regions of the relatively arranged, at least one compressed, repeating exposure pattern and the non-compressed, non-repeating exposure pattern of the composite pattern are to be scanned, the zigzag scanning locus being defined in accordance with defining a path of minimum length through which the exposure beam is deflected when proceeding from each unit deflection region, which has been scanned and thereby exposed in accordance with the respective portion of the corresponding exposure data, to a next successive unit deflection region, which is to be scanned and thereby exposed in accordance with the respective portion of the corresponding exposure data, for all of the unit deflection regions of the relatively arranged patterns of the composite pattern; and (c) successively scanning and thereby exposing the resist layer in accordance with the unit deflection regions and sequentially, in the order defined by the zigzag scanning locus, for all unit deflection regions of the relatively arranged exposure s of the composite pattern;

(d) developing the exposed resist layer so that a resist mask remains;

(e) etching the pattern layer using the resist mask so that the exposure patterns are formed by the remaining pattern layer; and (f) removing the resist mask.

11. A pattern exposure method as recited in claim 10, further comprising:

defining, arbitrarily, an XY coordinate system of transverse X and Y axes relative to the region of the object on which the composite pattern is to be exposed, the composite pattern having a width along the X-axis and a height along the Y-axis; and defining the zigzag scanning locus so as to include successive, minimum length paths progressing along the X-axis, for the width of the composite pattern, in an alternating succession of positive and negative, and thus opposite, directions along the X-axis at corresponding and successive Y-axis positions, determined by successive, minimum length parts progressing in a positive direction along the Y-axis for the height of the complex pattern, and so as to include a minimum length path along the Y-axis intermediate and interconnecting the successive, alternate and opposite minimum paths in the X-axis direction.

12. A pattern exposure method as recited in claim 11, further comprising:

defining a center of each unit deflection region; and defining the zigzag scanning locus so to pass through the center of each unit deflection region.

13. A pattern forming method as recited in claim 10, wherein the composite pattern formed on the substrate in accordance with the exposure of the resist layer defines an element, the element being selected from the group consisting of mask, substrate and semiconductor device elements.

14. A pattern exposure method as recited in claim 4, wherein the respective paths of minimum length, through which the exposure beam is deflected when proceeding from each deflection unit to a next successive unit deflection region, are of variable length in accordance with the spacing of the respective, successive unit deflection regions.

15. A pattern exposure method as recited in claim 10, wherein the respective paths of minimum length, through which the exposure beam is deflected when proceeding from each deflection unit to a next successive unit deflection region, are of variable length in accordance with the spacing of the respective, successive unit deflection regions.

* * * * *

UNITED STATES PATENT AND TRADEMARK OFFICE
CERTIFICATE OF CORRECTION

PATENT NO. : 5,337,247
DATED : August 9, 1994
INVENTOR(S) : HAMAGUCHI

It is certified that error appears in the above-indentified patent and that said Letters Patent is hereby corrected as shown below:

Col. 8, line 54, change "x-axis" to --X-axis--;
line 58, after "PB" insert --,--;
line 59, after "respectively" insert --, and respectively--.

Col. 9, line 5, after " '2' " insert --,--.

Col. 10, line 22, change "Unit" to --unit--.

Col. 14, line 41, change "non-repeating" to --deflection--.

Col. 15, line 27, after "opposite" insert --,--.

Col. 17, line 35, change "s" to --patterns--.

Signed and Sealed this

Twenty-ninth Day of November, 1994

Attest:

BRUCE LEHMAN

*Attesting Officer*  *Commissioner of Patents and Trademarks*